(12) United States Patent
Weng

(10) Patent No.: US 11,322,617 B2
(45) Date of Patent: May 3, 2022

(54) SEMICONDUCTOR DEVICE

(71) Applicant: SHANGHAI HUALI INTEGRATED CIRCUIT CORPORATION, Shanghai (CN)

(72) Inventor: Wenyin Weng, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 84 days.

(21) Appl. No.: 16/858,359

(22) Filed: Apr. 24, 2020

(65) Prior Publication Data

US 2021/0020771 A1  Jan. 21, 2021

(30) Foreign Application Priority Data

Jul. 17, 2019 (CN) .......................... 201910644723.8

(51) Int. Cl.
  *H01L 29/78* (2006.01)
  *H01L 27/088* (2006.01)
  *H01L 29/06* (2006.01)

(52) U.S. Cl.
  CPC ........ *H01L 29/785* (2013.01); *H01L 27/0886* (2013.01); *H01L 29/0638* (2013.01)

(58) Field of Classification Search
  CPC ............... H01L 29/785; H01L 27/0886; H01L 29/0638; H01L 29/4958; H01L 29/42372; H01L 29/0611; H01L 29/66537
  See application file for complete search history.

(56) References Cited

U.S. PATENT DOCUMENTS

| | | | |
|---|---|---|---|
| 2017/0005093 A1* | 1/2017 | Zhang | H01L 29/4983 |
| 2017/0162694 A1* | 6/2017 | Basker | H01L 21/823814 |
| 2017/0365602 A1* | 12/2017 | Zhou | H01L 29/66545 |
| 2020/0135879 A1* | 4/2020 | Cheng | H01L 27/0922 |

* cited by examiner

*Primary Examiner* — Cuong B Nguyen
(74) *Attorney, Agent, or Firm* — Alston & Bird LLP

(57) ABSTRACT

A semiconductor FinFET device includes a first work function layer configured to form a first threshold voltage and a second work function layer is configured to form a second threshold voltage. As the device is on, the channel region is divided laterally into a first portion and a second portion, wherein the first portion is located under the first work function layer, and wherein the second portion is located under the second work function layer. The first and second work function layers are configured such that the second threshold voltage is greater than the first threshold voltage to provide a higher withstanding voltage. The first work function layer comprises TiN, and the second work function layer comprises TiN and TiAl; or the first work function layer contains TiAl, and the second work function layer comprises TiN and TiAl.

18 Claims, 3 Drawing Sheets

SEMICONDUCTOR DEVICE

CROSS-REFERENCES TO RELATED APPLICATIONS

This application claims priority to Chinese patent application No. CN 201910644723.8, filed on Jul. 17, 2019 at CNIPA, and entitled "SEMICONDUCTOR DEVICE", the disclosure of which is incorporated herein by reference in entirety.

TECHNICAL FIELD

The present application relates to a semiconductor integrated circuit, and in particular to a semiconductor device.

BACKGROUND

The metal-oxide-semiconductor field-effect transistor (MOSFET), also known as the metal-oxide-silicon transistor (MOS transistor, or MOS), is a type of insulated-gate field-effect transistor that is fabricated by the controlled oxidation of a semiconductor, typically silicon. The voltage of the covered gate determines the electrical conductivity of the device; this ability to change conductivity with the amount of applied voltage can be used for amplifying or switching electronic signals.

FIG. 1 shows a schematic diagram of an existing MOSFET, an NMOS as an example here. The existing MOSFET (NMOS) has the following parts:

A P-type doped well region 2 (e.g., a P-well 2) which is formed on the surface of a semiconductor substrate 1 (e.g., a silicon substrate 1), wherein the semiconductor substrate 1 is usually P+ doped.

A gate structure includes a gate dielectric layer 3 such as an oxide layer and a polysilicon gate 4.

The source region 5 is an N+ doped well and a drain region 6 is also an N+ doped well, both formed in the P-well region 2, one on each side of the dielectric layer 3 of the gate structure, respectively.

In FIG. 1, the top surface of the P-well 2 under the gate structure is a doped area connecting the source region 5 and the drain region 6. This doped region is a channel region which will form a channel in the device once it is turned on. When IC devices got smaller, the active regions in the channel region have shrank to nanometer size and thin, gate voltages breakdowns challenge the structure, forcing gate voltages to be ever lower. The existing MOSFETs like the one shown in FIG. 1 have a limited voltage withstanding holding capability to avoid breakdowns, especially for low-voltage applications.

To improve the voltage withstanding holding capability of the MOSFET transistor devices, one of the current solutions is to add a drift region near the drain region in the device shown in FIG. 1.

FIG. 2 shows a schematic structural diagram of an laterally-diffused metal-oxide semiconductor (LDMOS) having a drift region. LDMOS devices are widely used in RF power amplifiers for base-stations as the requirement is for high output power with a corresponding drain to source breakdown voltage usually above certain volts, a relatively high voltage typically used in MOSFETs. An exemplary LDMOS can be an N-type device which includes: a semiconductor substrate 201 (e.g., a silicon wafer,) an N-well 207 formed in the substrate 201, a P-well 202 is formed in the N-well 207. P-well 202 and N-well 207 are arranged at both ends under the gate structure 204, but P-well 202 is less deep as N-well 207.

A gate structure includes a gate dielectric layer 203, such as a silicon oxide layer, is formed under a polysilicon gate 204.

An N+ doped source region 205 is formed in the P-well 202 on one side of the gate structure, and an N+ doped drain region 206 is formed in the N-well 207 on the other side of the gate structure.

A P+ doped body extraction region 208 is further formed in the P-well 202 on the farther lateral side of the source region 205.

In FIG. 2, a top layer of the P-well 202 under the dielectric layer 203 of the gate structure forms the channel when the device is turned on.

The area between the P-well 202 and the drain region 206 becomes the drift region. When a high voltage is applied to the drain region 206, the drift region in upper side of the N-well 207 is depleted of charges, thus can withstand the relatively high voltage. Compared with the simple MOSFET structure shown in FIG. 1, the LDMOS shown in FIG. 2 has got an extra depleted drift area in the channel region near the drain region 206. The additional drift region improve the voltage withstanding capability.

A fin field-effect transistor (FinFET) is a multigate device, a MOSFET built on a substrate where the gate is placed on two, three, or four sides of the channel or wrapped around the channel, forming a double gate structure. These devices have been given the generic name "FINFETs" because the source/drain region forms fins on the silicon surface. The FinFET devices have significantly faster switching times and higher current density than planar CMOS (complementary metal-oxide-semiconductor) technology. FinFET is a type of non-planar transistor, or "3D" transistor. It is the basis for modern nanoelectronic semiconductor device fabrication. Because of the three-dimensional channel structures, FinFETs have better on-current and off-current characteristics. FINFETs also improve short-channel effects (SCE), such as for example, leakage induced barrier lowering (DIBL) and sub-threshold slope (SS).

FIG. 3 is a perspective view of the structural diagram of a current FinFET. The FinFET includes fin 102 made of a material like silicon and displaced on the silicon substrate 101. The fins 102 have the shape of nano-strips or nano-sheets standing on the substrate 101. The two fins 102 of each device are arranged in parallel with those of other devices on the same silicon substrate 101 and are isolated from each other by a dielectric layer 103.

A gate structure 105 is made to wrap around the top surface and side surfaces of the fins 102, forming the channel. As shown from FIG. 3, arrows 108 point to the channel at the top and side surfaces of the fins 102.

In FIG. 3, the gate structure includes a gate dielectric layer 104 and a gate conductive material layer over the dielectric layer 104. Typically, the material of the gate dielectric layer 104 is a high dielectric constant (HK) material. The gate conductive material layer 105 forms the metal gate (MG).

A source region 106 and a drain region 107 are formed in the fins 102 on both sides of the gate structure.

FIG. 4 is a cross-sectional view of the fins 102 structure taken along a channel direction of a top surface of the fin 102. The material of the fins 102 is typically silicon. When the device is turned on, the area between the source and drain is directly composed of an inversed layer of the silicon material. FIG. 4 shows a work function layer 110a between the gate dielectric layer 104 and the metal gate 105.

The gate dielectric layer 104 further includes a first barrier layer 109, and the first barrier layer 109 is located between the high dielectric constant layer 104 and the work function layer 110a.

The material of the first barrier layer 109 often includes a metal nitride. Typically, the metal nitride constituting the first barrier layer 109 includes titanium nitride (TiN), tantalum nitride (TaN).

If the FinFET is a P-type device, the work function layer 110a is typically composed of TiN. If the FinFET is an N-type device, the work function layer 110a is composed of TiAl.

It is usually difficult for the existing FinFET to implement an LDMOS structure similar to that shown in FIG. 2, for the challenge of forming the drift region on the side, near the drain end, of the channel composed of the fins 102. The challenge has come from a number of reasons as follows:

First, once the device is turned on, the channel 108 of the current FinFET is formed in the fin 102. All wells are doped with ion implantation or another doping process. The balance between the channel doping and drift region doping is tricky. Channel needs high carrier mobility so high dose is required. However, doping level in the drift area is low.

Second, the channel region 108 composed of the fins 102 needs to be fully depleted at times; however, the introduction of the drift region will close fully depleted channel region.

In many semiconductor devices, relatively high voltage may need to apply on device drains (i.e., high-withstanding voltage semiconductor devices). For example, these devices include display drive devices, power supply IC controllers, and microwave, RF or power amplifiers. Thus, there is a need to improve the voltage withstanding capability of FinFETs without changing the doping conditions of the channel region.

BRIEF SUMMARY

According to some embodiments of the current disclosure, the semiconductor device includes a semiconductor FinFET device includes a gate structure, and a first work function layer and a second work function layer laterally connected to the first work function layer in the gate structure. The first work function layer is configured to form a first threshold voltage, wherein the second work function layer is configured to form a second threshold voltage. The channel region is divided laterally into a first portion and a second portion, wherein the first portion is located under the first work function layer, and wherein the second portion is located under the second work function layer.

The first threshold voltage and the second threshold voltage are inversed respectively, the inversed second threshold voltage is greater than the inversed first threshold voltage to provide a higher withstanding voltage. The first work function layer comprises TiN, and the second work function layer comprises TiN and TiAl; or the first work function layer contains TiAl, and the second work function layer comprises a TiN and TiAl.

In some cases, the semiconductor substrate is a silicon substrate.

In some cases, the semiconductor device is a FinFET.

In some cases, the channel region is formed in a fin, wherein the fin comprises a semiconductor material, and wherein the fin comprise a nano-strip or nano-sheet structure.

In some cases, the source region and the drain region are formed in the fin.

In some cases, the fin is arranged in parallel and electrically isolated from a fin of a neighboring semiconductor device.

In some cases, an embedded epitaxial layer is formed in the source region or the drain region.

In some cases, a material of the embedded epitaxial layer comprises silicon germanium.

In some cases, the gate dielectric layer comprises a high dielectric constant layer.

In some cases, the gate dielectric layer further comprises an interface layer located between the high dielectric constant layer and the channel region.

In some cases, the gate dielectric layer further comprises a first barrier layer located between the high dielectric constant layer and the work function layer.

In some cases, a material of the first barrier layer comprises a metal nitride.

In some cases, the metal nitride constituting the first barrier layer comprises titanium nitride or tantalum nitride.

In some cases, the semiconductor device is a P-type device, the first conductivity type is P-type, and the second conductivity type is N-type; wherein the first work function layer comprises a TiN layer, and the second work function layer comprises a TiAl layer.

In some cases, the second work function layer further comprises a TiN layer.

In some cases, the semiconductor device is an N-type device, the first conductivity type is N-type, and the second conductivity type is P-type; wherein a material of the first work function layer comprises a TiAl layer, and the second work function layer comprises a TiN layer.

In some cases, the second work function layer further comprises a TiAl layer in direct contact on said TiN layer.

In some cases, a material of the metal gate is aluminum (Al) or tungsten (W).

BRIEF DESCRIPTION OF THE DRAWINGS

The present disclosure will be described in further detail below with reference to the accompanying drawings and specific embodiments.

DETAILED DESCRIPTION OF THE DISCLOSURE

Figure 1:
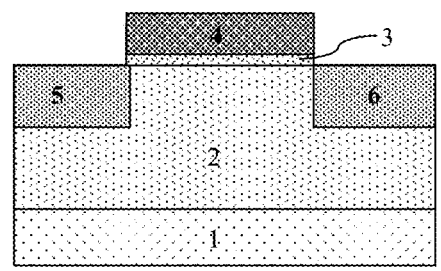
FIG. 1 is a schematic diagram of an existing MOSFET.
Figure 2:
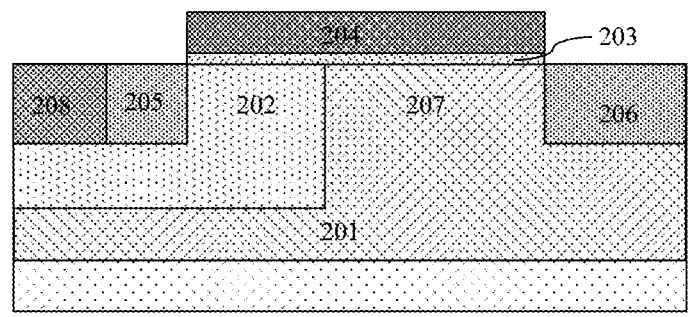
FIG. 2 is a schematic diagram of an existing LDMOS.
Figure 3:
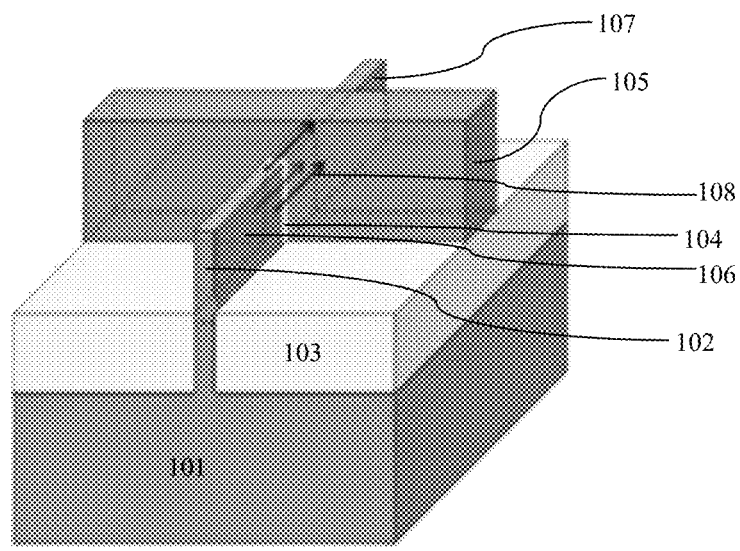
FIG. 3 is a perspective structural diagram of an existing FinFET.
Figure 4:
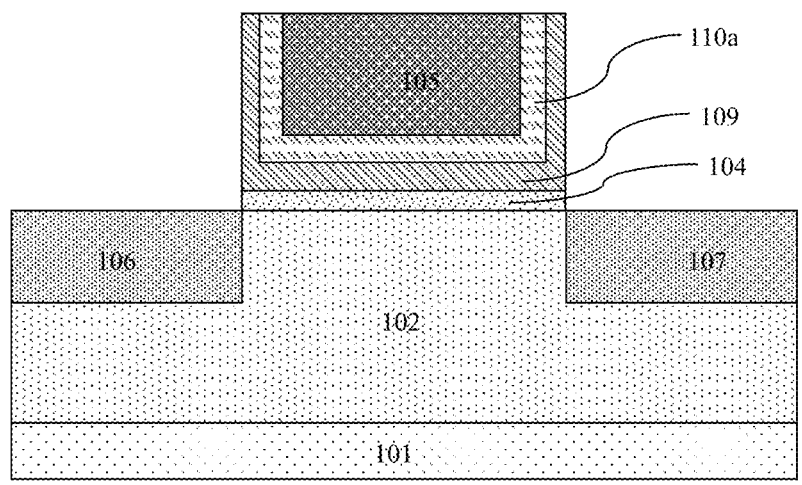
FIG. 4 is a cross-sectional view of the existing FinFET of FIG. 3.
Figure 5:
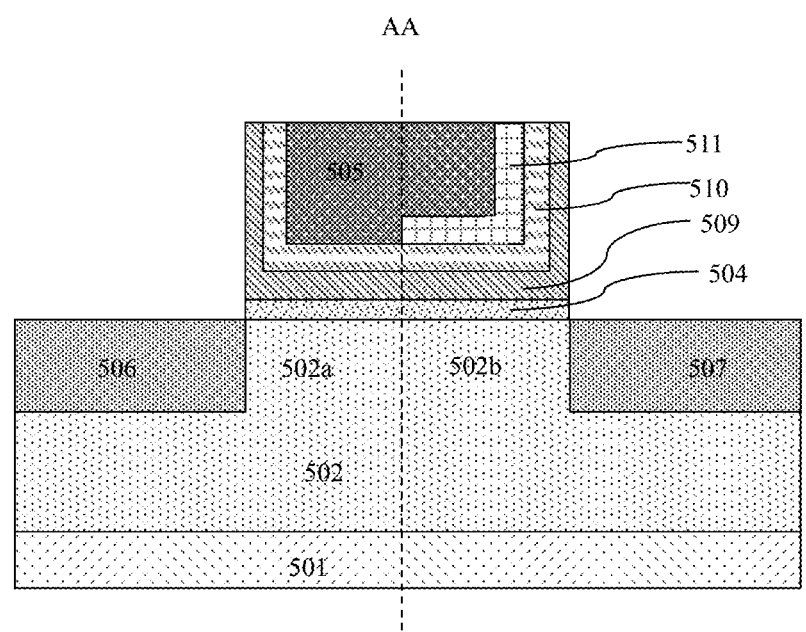
FIG. 5 is a cross-sectional view of a structure of a semiconductor device, according to an embodiment of the present disclosure.

As shown in FIG. 5, it is a cross-sectional view of a semiconductor device, according to an embodiment of the present disclosure. The semiconductor device includes a gate structure 510, a channel region divided into tro portions 502a and 502b, a source region 506, and a drain region 507.

The channel region formed on a surface of a semiconductor substrate 501 is composed of a well region 502 doped with the second conductivity type. The semiconductor substrate 501 may be a silicon wafer but not limited to such substrate.

The source region 506 and the drain region 507 are formed on two sides of the gate structure 510 in the semiconductor substrate 501 and both are heavily doped with the first conductivity type. In FIG. 5, the region 502 is disposed on the surface of the semiconductor substrate 501 in the entire region where the semiconductor device is. The source region 506 and the drain region 507 are formed at ends of the region 502a and 502b in the channel region. Both source and drain are doped with the second conductivity type dopants.

The gate structure 510 comprises a gate dielectric layer 504 and a metal gate 505, a work function layer disposed between the gate dielectric layer 504 and the metal gate 505, and the work function layer has a first work function layer and a second work function layer which are connected laterally. The part of the channel region under the first work function layer is a region 502a configured to function at a first threshold voltage, and the part of the channel region under the second work function layer is a region 502b configured to function at a second threshold voltage.

As shown in FIG. 5, the work function layer according to the embodiment of the present disclosure includes two layers, which are layers 510a and 510b, and 511 directly disposed on part of the work function layer 510b respectively; wherein the first work function layer is composed of the layer 510a and the second work function layer is composed of the layers 510b and 511 on 510b.

One end of region 502a configured to have the first threshold voltage is in contact with the source region 506, a second end of the region 502a is in contact with one end of the region 502b configured to have the second threshold voltage, and another end of the region 502b configured to have the second threshold voltage is in contact with the drain region 507.

Configuring a first threshold voltage in the region 502a to forma voltage inversed channel through the first work function layer, and configuring a second threshold voltage in the region 502b to form a voltage inversed channel through the second work function layer. The second threshold voltage is set to be greater than the first threshold voltage. When the semiconductor device is turned on, an inversion current in the region 502b is smaller than an inversion current in the first threshold voltage region 502b, and then the region 502b of the second threshold voltage becomes a voltage holding region 502b.

According to some embodiments of the present disclosure, the semiconductor device is a FinFET. FIG. 5 is a cross-sectional view taken along a channel direction of a top surface of the fins 502. The channel is formed in the fin 502, the fin 502 is doped with the second conductivity type dopants. The region 502 shown in FIG. 5 are doped with the second conductivity type dopants. As a further improvement, the channel is formed in the fin and is composed of a semiconductor material the same as in the semiconductor substrate 501. The fin 502 has a nano-strip or nano-sheet shape.

The source region 506 and the drain region 507 are formed in the fins 502 on both sides of the gate structure 510.

The fins 502 on the silicon substrate 501 are arranged in parallel and isolated from each other by a dielectric layer 503.

An embedded epitaxial layer is formed in the source region 506 or the drain region 507. Preferably, the material of the embedded epitaxial layer includes silicon germanium.

The gate dielectric layer 504 includes a high dielectric constant (HK) material.

The gate dielectric layer 504 further includes an interface layer, and the interface layer is located between the high dielectric constant HK layer and the semiconductor substrate 501. Typically, the interface layer is made of silicon oxide.

The gate dielectric layer 504 further includes a first barrier layer 509, and the first barrier layer 509 is located between the high dielectric constant HK layer 504 and the work function layers 510 and 511.

The material of the first barrier layer 509 includes a metal nitride; preferably, the metal nitride constituting the first barrier layer 509 includes titanium nitride (TiN) or tantalum nitride (TaN).

According to the embodiments of the present disclosure, the semiconductor device is a P-type device, its first conductivity type is P-type, and its second conductivity type is N-type. The first work function layer 510a is composed of a TiN layer, and the second work function layers 510b and 511 are composed of a TiAl layer or a TiN layer and a TiAl layer which are on top of the TiAl or TiN. As shown in FIG. 5, layer 510a and 510b (same layer) is a TiN layer, and layer 511 is a TiAl layer.

Alternatively, in other embodiments, the semiconductor device is an N-type device, its first conductivity type is N-type, and its second conductivity type is P-type. The material of the first work function layer 510a and 510b (same layer) is TiAl, and the second work function layer 511 is composed of a TiN layer or a TiAl layer which is disposed directly on the TiAl.

The material of the metal gate 505 is Al or W.

The gate structure 510 in the embodiment of the present disclosure includes a metal gate 505, and the work function layers 511 and 510a and 510b in the gate structure 510 are specifically set. The work function layers are laterally divided into a first work function layer and a second work function layer that are laterally connected. The part of the channel under the first work function layers 510a is the region 502a with the first threshold voltage. The part of the channel under the second work function layers 510b and 511 is the region 502b with the second threshold voltage. The first and second threshold voltages in regions 502a and 502b are adjusted by configuring the right first and second work function layers. The second threshold voltage of the second threshold voltage region 502b is set to be higher than the first threshold voltage of the first threshold voltage region 502a. In addition, the second threshold voltage region 502b is close to the drain region 507. In this way, when the semiconductor device is turned on, the inversion current in the second threshold voltage region 502b is smaller than the inversion current in the first threshold voltage region 502a, so that the second threshold voltage region 502b is functionally similar to the drift region in a LDMOS device, so the second threshold voltage region 502b e can be applied as the withstanding voltage region. The device's withstanding voltage can be improved The implementation of the second threshold voltage region 502b does not need to change the dopant conditions of the channel region.

The embodiment of the present disclosure is particularly suitable for improving the withstanding voltage of a FinFET. When the structure of the invention is applied to a FinFET, the withstanding voltage of the FinFET can be improved without changing or reducing the implanted ion concentration in the channel region. When the dopant concentration in the channel region is kept low or reduced, the carrier mobility of the device can be enhanced and the electrical performance of the device can be improved.

The present disclosure has been described in detail through specific embodiments, but these do not constitute a limitation on the present disclosure. Many variations and improvements can be made by those skilled in the art without departing from the principle of the present disclo-

What is claimed is:

1. A semiconductor device, comprising:
a semiconductor substrate;
a gate structure, a source region and a drain region formed on the substrate, and a channel region formed between the source and the drain regions;
wherein the source region and the drain region are formed on two sides of the gate structure, and are both heavily doped with ions of a first conductivity type, wherein the channel region comprises a dopant of a second conductivity type;
wherein the gate structure comprises,
a gate dielectric layer, a metal gate, a work function layer disposed between the gate dielectric layer and the metal gate;
wherein the work function layer comprises a first work function layer and a second work function layer laterally connected to the first work function layer;
wherein the first work function layer is configured to form a first threshold voltage, wherein the second work function layer is configured to form a second threshold voltage;
wherein the channel region is divided laterally into a first portion and a second portion, wherein the first portion is located under the first work function layer, and wherein the second portion is located under the second work function layer;
wherein one side of the first portion of the channel region contacts the source region, and one side of the second portion of the channel region contacts the drain region;
wherein by configuring the first work function layer and the second work function layer, the second threshold voltage is greater than the first threshold voltage to provide a higher withstanding voltage;
wherein an inversion current in the second portion of the channel region is smaller than an inversion current in the first portion of the channel region;
wherein the semiconductor device is a P-type device, the first conductivity type is P-type, and the second conductivity type is N-type;
wherein the first work function layer comprises a TiN layer; and
wherein the second work function layer comprises a TiAl layer and a TiN layer.

2. The semiconductor device according to claim 1, wherein the semiconductor substrate is a silicon substrate.

3. The semiconductor device according to claim 2, wherein the semiconductor device is a FinFET.

4. The semiconductor device according to claim 3, wherein the channel region is formed at a fin, wherein the fin comprises a semiconductor material, and wherein the fin further comprise a nano-strip or nano-sheet structure.

5. The semiconductor device according to claim 4, wherein the source region and the drain region are formed in the fin.

6. The semiconductor device according to claim 4, wherein the fin is arranged in parallel and electrically isolated from a fin of a neighboring semiconductor device.

7. The semiconductor device according to claim 5, wherein an embedded epitaxial layer is formed in the source region or the drain region.

8. The semiconductor device according to claim 7, wherein a material of the embedded epitaxial layer comprises silicon germanium.

9. The semiconductor device according to claim 1, wherein the gate dielectric layer is characterized with a high dielectric constant.

10. The semiconductor device according to claim 9, wherein the gate dielectric layer further comprises an interface layer located between the high dielectric constant layer and the channel region.

11. The semiconductor device according to claim 10, wherein the gate dielectric layer further comprises a first barrier layer located between the high dielectric constant layer and the work function layer.

12. The semiconductor device according to claim 11, wherein a material of the first barrier layer comprises a metal nitride.

13. The semiconductor device according to claim 12, wherein the metal nitride constituting the first barrier layer comprises titanium nitride or tantalum nitride.

14. The semiconductor device according to claim 1, wherein a material of the metal gate is aluminum (Al) or tungsten (W).

15. A semiconductor device, comprising:
a semiconductor substrate;
a gate structure, a source region and a drain region formed on the substrate, and a channel region formed between the source and the drain regions;
wherein the source region and the drain region are formed on two sides of the gate structure, and are both heavily doped with ions of a first conductivity type, wherein the channel region comprises a dopant of a second conductivity type;
wherein the gate structure comprises,
a gate dielectric layer, a metal gate, a work function layer disposed between the gate dielectric layer and the metal gate;
wherein the work function layer comprises a first work function layer and a second work function layer laterally connected to the first work function layer;
wherein the first work function layer is configured to form a first threshold voltage, wherein the second work function layer is configured to form a second threshold voltage;
wherein the channel region is divided laterally into a first portion and a second portion, wherein the first portion is located under the first work function layer, and wherein the second portion is located under the second work function layer;
wherein one side of the first portion of the channel region contacts the source region, and one side of the second portion of the channel region contacts the drain region;
wherein by configuring the first work function layer and the second work function layer, the second threshold voltage is greater than the first threshold voltage to provide a higher withstanding voltage;
wherein an inversion current in the second portion of the channel region is smaller than an inversion current in the first portion of the channel region;
wherein the semiconductor device is an N-type device, the first conductivity type is N-type, and the second conductivity type is P-type; wherein a material of the first work function layer comprises a TiAl layer, and the second work function layer comprises a TiN layer; and
wherein the second work function layer further comprises a TiAl layer in direct contact on said TiN layer.

16. The semiconductor device according to claim 15, wherein the gate dielectric layer is characterized with a high dielectric constant.

17. The semiconductor device according to claim 16, wherein the gate dielectric layer further comprises an interface layer located between the high dielectric constant layer and the channel region.

18. The semiconductor device according to claim 17, wherein the gate dielectric layer further comprises a first barrier layer located between the high dielectric constant layer and the work function layer.

* * * * *